(12) United States Patent
Wittenbreder, Jr.

(10) Patent No.: US 7,714,548 B1
(45) Date of Patent: May 11, 2010

(54) ADAPTIVE SWITCH TIMING CIRCUITS FOR ZERO VOLTAGE SWITCHING POWER CONVERTERS

(76) Inventor: Ernest Henry Wittenbreder, Jr., 3260 S. Gillenwater Dr., Flagstaff, AZ (US) 86001-8946

( * ) Notice: Subject to any disclaimer, the term of this patent is extended or adjusted under 35 U.S.C. 154(b) by 239 days.

(21) Appl. No.: 11/937,340

(22) Filed: Nov. 8, 2007

(51) Int. Cl.
*G05F 1/40* (2006.01)
(52) U.S. Cl. ..................................... 323/235
(58) Field of Classification Search ............... 323/235, 323/271, 282, 284; 363/16, 17, 21.01; 327/365, 327/403, 434
See application file for complete search history.

(56) References Cited

U.S. PATENT DOCUMENTS

| | | | | |
|---|---|---|---|---|
| 6,144,245 A | * | 11/2000 | Balogh | 327/380 |
| 6,369,557 B1 | * | 4/2002 | Agiman | 323/282 |
| 6,462,963 B1 | * | 10/2002 | Wittenbreder | 363/16 |
| 6,580,255 B1 | * | 6/2003 | Wittenbreder, Jr. | 323/235 |
| 6,614,288 B1 | * | 9/2003 | Dagan et al. | 327/365 |
| 6,822,427 B2 | * | 11/2004 | Wittenbreder | 323/282 |
| 6,856,522 B1 | * | 2/2005 | Wittenbreder, Jr. | 363/21.01 |
| 7,095,220 B2 | * | 8/2006 | Kernahan | 323/300 |
| 7,110,269 B2 | * | 9/2006 | Cao et al. | 363/21.03 |
| 7,265,601 B2 | * | 9/2007 | Ahmad | 327/403 |
| 7,274,243 B2 | * | 9/2007 | Pace et al. | 327/396 |
| 7,456,620 B2 | * | 11/2008 | Maksimovic et al. | 323/283 |
| 7,466,168 B1 | * | 12/2008 | Wittenbreder, Jr. | 327/108 |
| 2003/0205990 A1 | * | 11/2003 | Wittenbreder, Jr. | 323/222 |
| 2004/0228153 A1 | * | 11/2004 | Cao et al. | 363/71 |
| 2005/0285661 A1 | * | 12/2005 | Wittenbreder, Jr. | 327/434 |
| 2006/0033453 A1 | * | 2/2006 | Cao et al. | 315/291 |

* cited by examiner

*Primary Examiner*—Adolf Berhane
*Assistant Examiner*—Yemane Mehari

(57) ABSTRACT

The subject invention reveals new adaptive gate drive timing circuits that are optimal for both sufficient energy and insufficient energy conditions for optimal turn on transition timing of a power mosfet in a zero voltage switching power supply. The circuit does not rely on a rectifier connected to the drain of the power mosfet to detect the zero voltage condition of the mosfet. The circuit relies on the detection of a discharge current in a capacitance connected to the drain of the power mosfet. Turn on of the mosfet is held off while discharge current exists and the gate of the mosfet is enabled at the instant that the discharge current drops to zero. In one embodiment of the invention discharge current of the intrinsic gate drain capacitance of the mosfet is relied upon as the source of timing information.

3 Claims, 9 Drawing Sheets

ADAPTIVE SWITCH TIMING CIRCUITS FOR ZERO VOLTAGE SWITCHING POWER CONVERTERS

BACKGROUND OF THE INVENTION

1. Field of the Invention

The subject invention generally pertains to electronic power conversion circuits, and, more specifically, to high frequency, switched mode electronic power converters. The subject matter relates to new adaptive timing circuits that achieve optimal switch turn on timing for switches in high efficiency zero voltage switching power converters.

2. Description of Related Art

Zero voltage switching (ZVS) power converters have been demonstrated to provide significant efficiency advantages over conventional hard switching power converters, particularly for off line power supplies. The ZVS power converters eliminate drain circuit switching losses and some of the gate circuit switching losses, they eliminate rectifier reverse recovery effects, and, when the die sizes of the switches are optimized for minimum power loss they also achieve significant reductions in channel conduction losses.

In order to achieve the maximum benefit of zero voltage switching it is important to optimally time the zero voltage turn on transition. The problem is illustrated in FIG. 1. The nature of the drain source voltage transition is dependent on the drain circuit current and the available stored drain circuit energy at the beginning of the transition, as illustrated in FIG. 1. The nature of the drain source voltage transition is also dependent on the amount of voltage swing. Ideally there would always be sufficient drain circuit energy to drive the drain source voltage to zero volts and the switch would be enabled at the instant that the drain source voltage reaches zero volts. In practice, the time needed to complete the transition to zero volts varies greatly and, in some cases, there may be insufficient energy available in the drain circuit to drive the drain source voltage to zero volts. For a transition in which the drain source voltage is driven to zero volts we want to enable the switch at the instant that the drain source voltage reaches zero. If the switch is turned on after the drain source voltage reaches zero volts then there will be a period of time in which the body diode of the switch conducts and there is also the possibility that the drain circuit current will reverse and increase the drain source voltage above zero before the switch is turned on. If the body diode is allowed to conduct then there will be additional forward voltage conduction losses associated with body diode conduction, as well as reverse recovery effects which will keep the body diode in a low impedance state for a time whether or not the body diode is reverse biased. Many ZVS circuits use a fixed delay time for turn on timing of the main switch. If the fixed delay time is optimal for the condition in which there is ample sufficient energy to drive the transition to zero volts then for the condition in which there is only adequate energy to drive the transition to zero volts the turn on timing may be premature and result in considerable turn on switching losses, as illustrated in FIG. 1. We can solve the problem by using a circuit that detects the drain source voltage and turns on the switch when its drain source voltage reaches zero volts. An example of a circuit that accomplishes optimal turn on timing for the case in which there is sufficient energy to drive the drain source voltage to zero volts is illustrated in FIG. 2 and is the subject of U.S. Pat. No. 6,580,255. The FIG. 2 circuit relies on a drain connected diode to pull the gate of a P channel mosfet low in order to enable the gate of a N channel power mosfet switch as its drain source voltage reaches zero volts.

For the case in which there is insufficient energy to drive the drain source voltage to zero the adaptive timing circuit illustrated in FIG. 2 is inadequate by itself. If the drain diode in FIG. 2 is not forward biased because the drain source voltage does not reach zero then the switch will not turn on. If a mechanism is employed that results in a maximum delay time before the switch turns on then, if the maximum delay time is equal to the time that it takes for the drain source voltage to reach its minimum, then large switching losses can be avoided, however, the time that it will take for the drain to reach a minimum is highly variable and depends on both the amount of drain circuit energy available and the off state voltage of the switch. U.S. Pat. No. 6,580,255 also reveals a circuit that can sense the minimum drain voltage and enable the switch at its minimum voltage. This circuit together with the FIG. 2 circuit is illustrated in FIG. 3. The operation of the FIG. 3 circuit is illustrated in FIG. 4 where the main switch is turned on optimally for both the sufficient energy condition and the insufficient energy condition. For the insufficient energy condition the drain connected capacitor $C_{INSUF}$ forward biases the base emitter junction of a NPN bipolar transistor $Q_{INSUF}$ when the drain source voltage reaches a minimum and begins to reverse direction. When $Q_{INSUF}$ turns on then the gate of a P channel mosfet $M_{INSUF}$ is enabled which allows charge to flow to the gate of the power mosfet main switch before its drain source voltage can rise up significantly, thereby minimizing turn on transition switching losses in $M_{MAIN}$. Most of the components of the FIG. 3 circuit can be accomplished with a low voltage application specific integrated circuit (ASIC) with the exception of the drain diode, indicated as $D_{DRAIN}$ in FIG. 2 and the capacitor $C_{INSUF}$, illustrated in FIG. 3. It would be beneficial to reduce the number of or eliminate the components that cannot be implemented in a low voltage ASIC.

OBJECTS AND ADVANTAGES

An object of the subject invention is to reveal new adaptive gate drive timing circuits that can provide optimal turn on timing for the initial condition in which there is sufficient energy to drive the transition to zero volts and for the initial condition in which there is insufficient energy to drive the turn on transition to zero volts that do not rely on a high voltage rectifier.

Another object of the subject invention is to reveal new adaptive gate drive timing circuits that can provide optimal turn on timing for the initial condition in which there is sufficient energy to drive the transition to zero volts and for the initial condition in which there is insufficient energy to drive the turn on transition to zero volts that can be accomplished with a low voltage ASIC without the use of any high voltage components.

Further objects and advantages of my invention will become apparent from a consideration of the drawings and ensuing description.

These and other objects of the invention are provided by novel circuit techniques that rely on the sensing of a capacitor discharge current and the sensing of the absence of capacitor discharge current to initiate the turn on transition of a main switch in a zero voltage switching power conversion circuit.

SUMMARY

The subject invention reveals new adaptive gate drive timing circuits for achieving optimal switch timing in zero voltage switching power converters for both the energy sufficient initial condition and the energy insufficient initial condition without the use of a high voltage rectifier. The subject invention also reveals a new adaptive gate drive timing circuit that achieves optimal switch timing without the use of any high voltage components.

DESCRIPTION OF THE PREFERRED EMBODIMENTS

Figure 1:
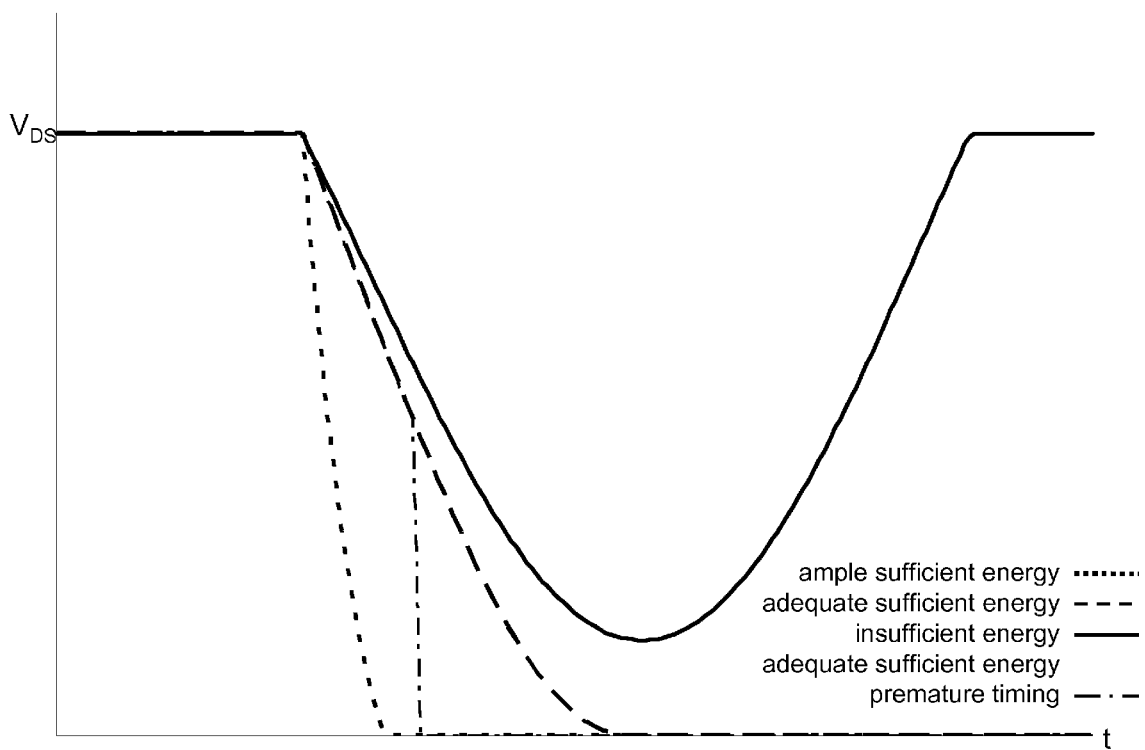
FIG. 1 illustrates turn on transition drain source voltage wave forms for a variety of common initial conditions.
Figure 2:
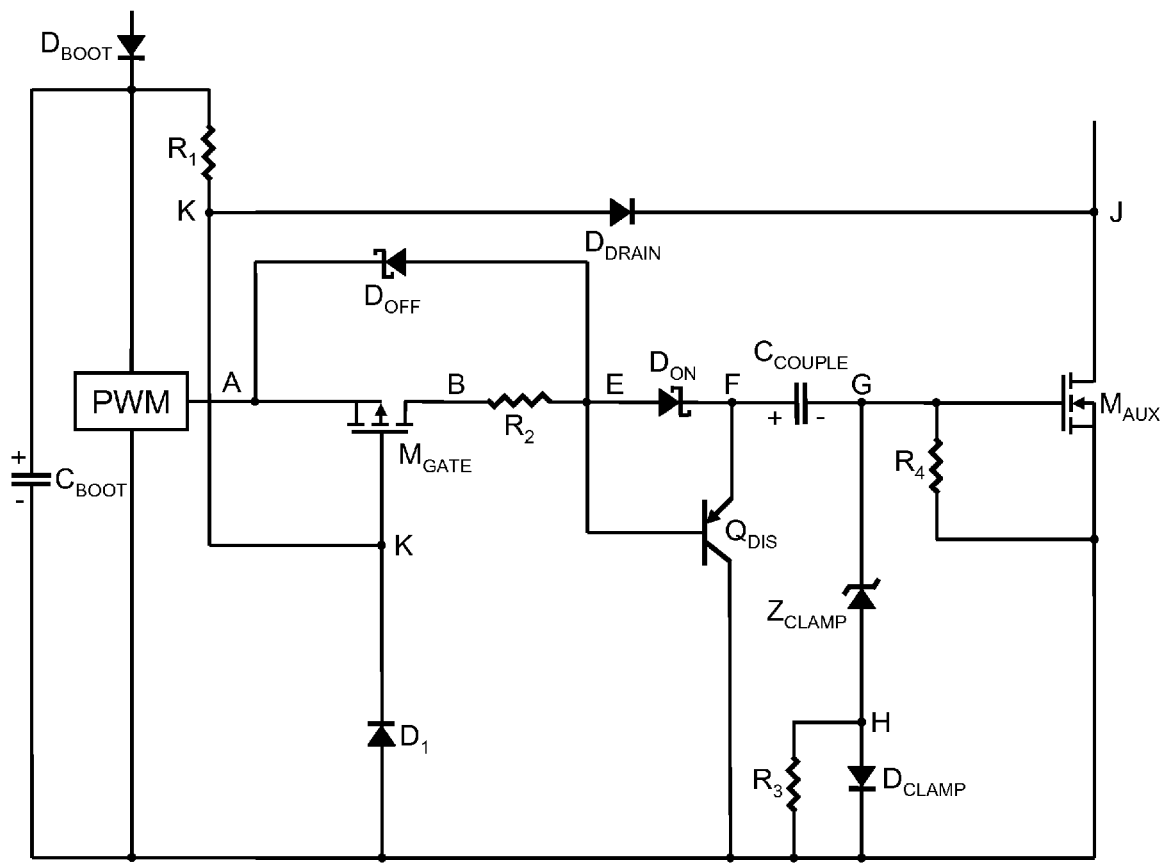
FIG. 2 illustrates an adaptive gate drive timing circuit that achieves optimal turn on timing for the energy sufficient initial condition relying on a high voltage rectifier according to the prior art.
Figure 3:
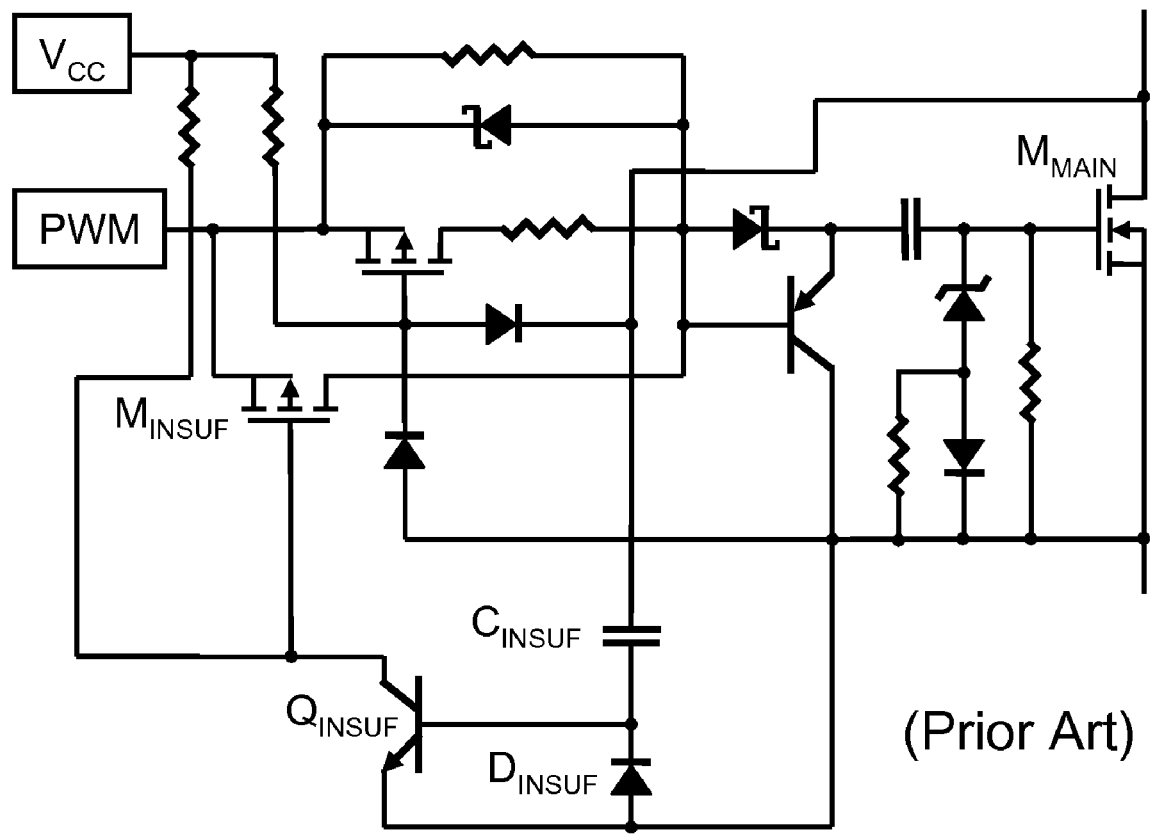
FIG. 3 illustrates an adaptive gate drive timing circuit that achieves optimal turn on timing for both the energy sufficient initial condition and the energy insufficient initial condition relying on a high voltage rectifier and a high voltage capacitor according to the prior art.
Figure 4:
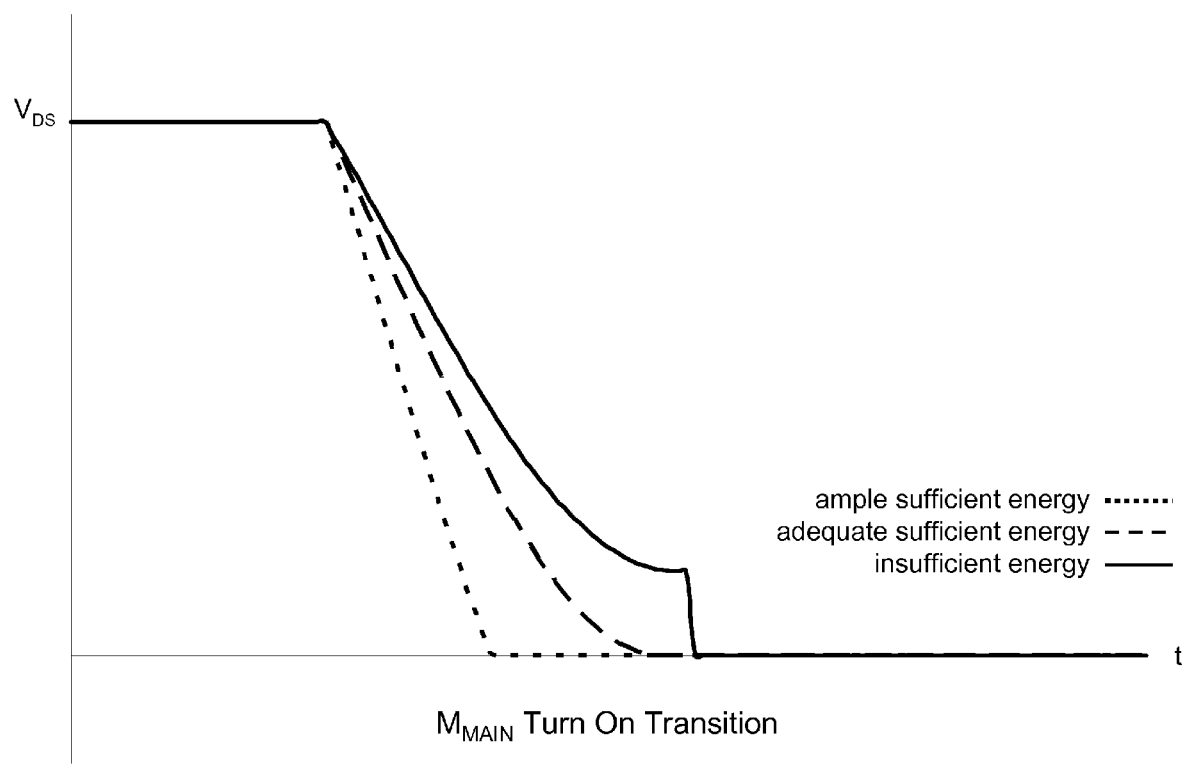
FIG. 4 illustrates turn on transition drain source voltage wave forms with optimal timing for both the energy sufficient and the energy insufficient initial conditions for a variety of common initial conditions.
Figure 5:
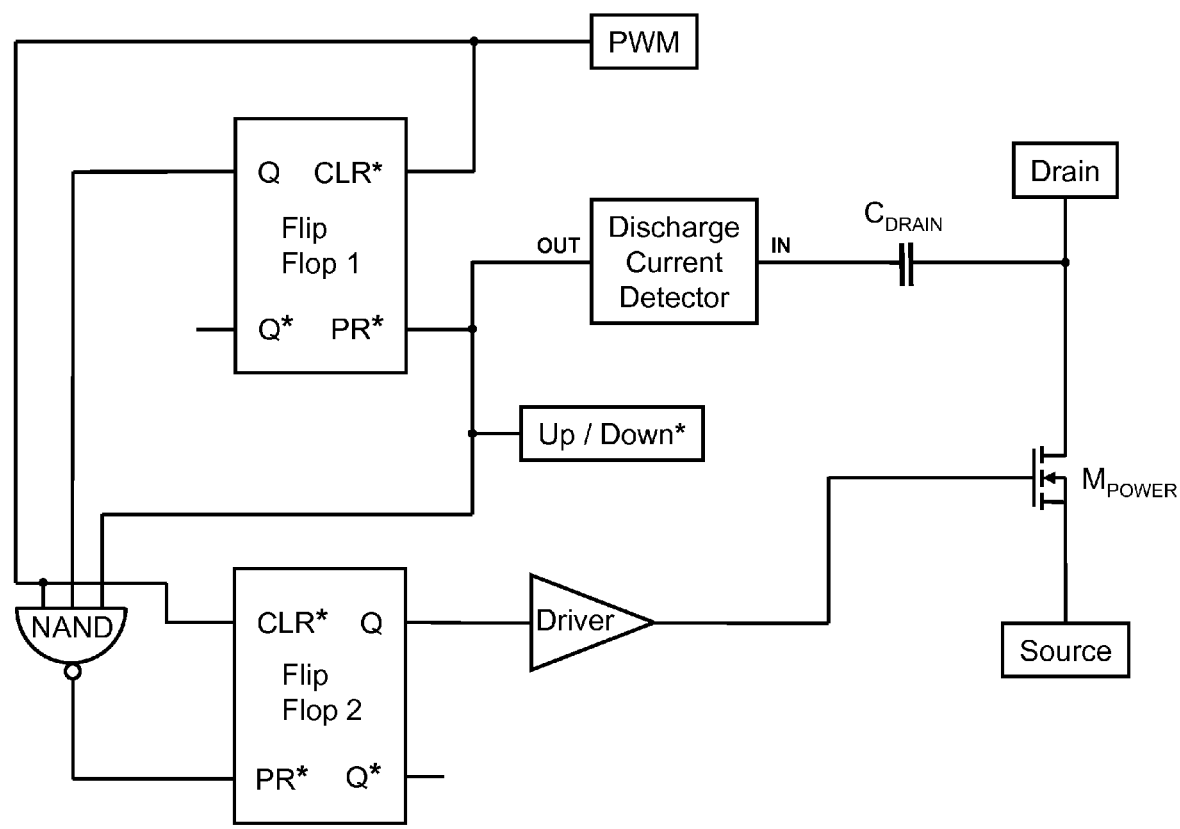
FIG. 5 illustrates an adaptive gate drive timing circuit which achieves optimal gate drive timing for both the energy sufficient initial condition and the energy insufficient initial condition without relying on a high voltage rectifier according to the subject invention.

FIG. 5 illustrates an adaptive gate drive timing circuit that provides optimal gate drive timing for a mosfet $M_{POWER}$ in a zero voltage switching power converter according to the subject invention. In FIG. 5 a first terminal of a capacitor $C_{DRAIN}$ is connected to a drain terminal of the mosfet $M_{POWER}$ and a second terminal of $C_{DRAIN}$ is connected to an input terminal of a discharge current detector circuit. An output terminal of the discharge current detector circuit is connected to a terminal PR* of a flip flop 1 and to a first input of a three input NAND gate. A pulse width modulated (PWM) control signal is connected to a CLR* terminal of flip flop 1, a CLR* terminal of a flip flop 2, and to a second input of the three input NAND gate. A Q output of flip flop 1 is connected to a third input of the three input NAND gate. An output of the three input NAND gate is connected to the PR* input of flip flop 2. A Q output of flip flop 2 is connected to an input terminal of a driver. An output of the driver is coupled to a gate terminal of the mosfet $M_{POWER}$.

Figure 6:
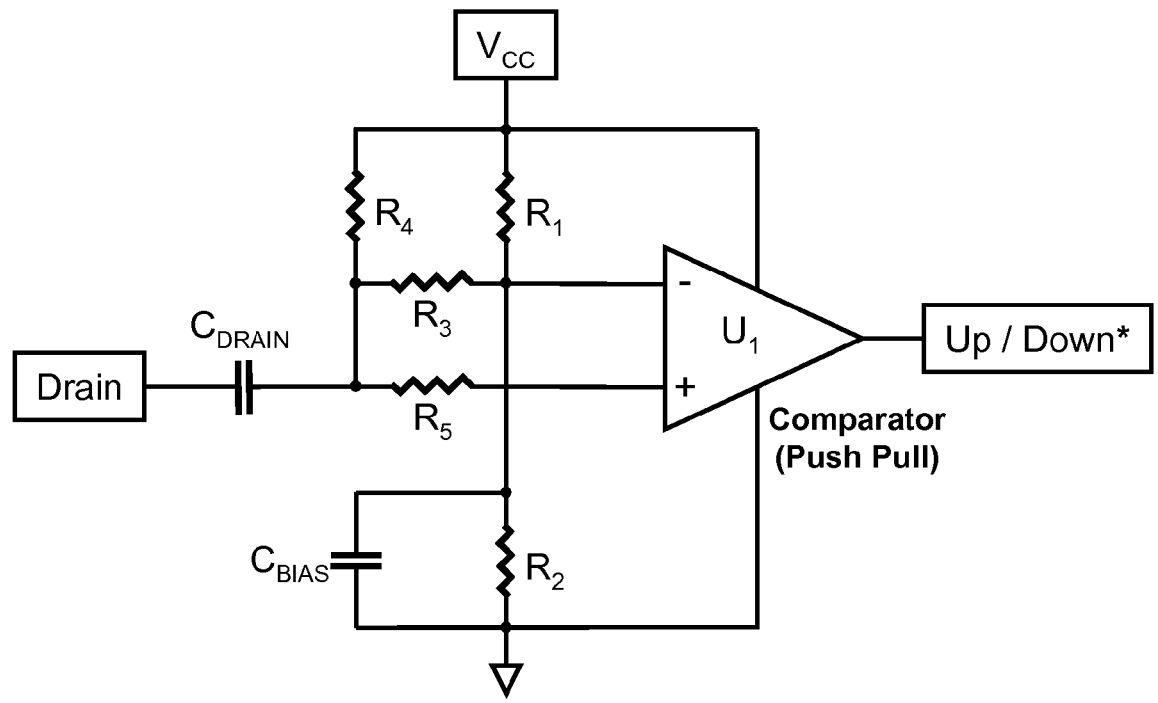
FIG. 6 illustrates an example of a discharge current detector circuit that is responsive to the discharge current in a drain connected capacitor according to the subject invention.

A discharge current detector circuit with the $C_{DRAIN}$ capacitor is illustrated in FIG. 6. The second terminal of $C_{DRAIN}$ is connected to a first terminal of a resistor $R_3$, a first terminal of a resistor $R_4$, and a first terminal of a resistor $R_5$. A second terminal of resistor $R_5$ is connected to a non-inverting input of a comparator $U_1$. A second terminal of resistor $R_3$ is connected to an inverting input of comparator $U_1$, to a first terminal of resistor $R_1$, a first terminal of a capacitor $C_{BIAS}$, and to a first terminal of a resistor $R_2$. A second terminal of resistor $R_4$ is connected to a positive supply voltage rail, to a second terminal of resistor $R_1$, and to a positive supply terminal of $U_1$. An output terminal of $U_1$, labeled UP/DOWN*, serves as the output terminal of the discharge current detector. A second terminal of $C_{BIAS}$ is connected to a second terminal of $R_2$, to a negative supply voltage rail, and to a negative supply terminal of $U_1$.

In operation a turn on transition is initiated when a PWM control signal, used for regulating a current or a voltage at an input or output of a power supply, transitions to a logic high state. Prior to the beginning of the turn on transition the PWM control signal is in a logic low state, which forces the Q outputs of flip flop 1 and flip flop 2 to be in logic low states and the Q* outputs of flip flop 1 and flip flop 2 to be in logic high states. A low PWM control signal also forces the output of the NAND gate to be in a logic high state. The output of the discharge current detector circuit is high when there is no discharge current, which is the typical case at the instant that the PWM control signal transitions to the high state initiating the turn on transition. The discharge current detector circuit is biased such that, even if there is a small discharge current, the output of the discharge current detector will be high. Soon after the PWM control signal goes high the drain terminal voltage of $M_{POWER}$ begins to fall, which forces the output of the discharge current detector circuit to a logic low state. The output of the NAND gate remains high since the output signal of the discharge current detector is in a logic low state. A logic low state at the PR* input of flip flop 1 forces the Q output of flip flop 1 to a logic high state. When the drain voltage of $M_{POWER}$ has reached a point where it is no longer falling, or falling only very slowly, then the output of the discharge current detector transitions from low to high and the output of the NAND gate transitions from high to low. The logic low output of the NAND gate forces the Q output of flip flop 2 to a high state and causes the driver to enable the gate of $M_{POWER}$. Whether the cause of the change in output state of the discharge current detector results from the drain source voltage of $M_{POWER}$ reaching zero volts or from the drain source voltage of $M_{POWER}$ reaching a minimum voltage is inconsequential and has the same effect, which is the desired effect of turning on the mosfet $M_{POWER}$ at the optimal instant. When the gate of $M_{POWER}$ is enabled the drain of $M_{POWER}$ begins to fall again, if the drain source voltage has not yet reached zero volts. When the drain source voltage begins to fall again the output of the discharge current detector changes from a logic high state to a logic low state, forcing the output of the NAND gate high. A logic high signal at the PR* input of flip flop 2 has no effect on its outputs, so the turn on transition of $M_{POWER}$ proceeds without interruption or delay. At the end of the on state of the power supply of which $M_{POWER}$ is a part the PWM control signal is driven to a logic low state clearing both flip flops so that the Q output of flip flop 2 transitions to a logic low state and the driver drives the gate of $M_{POWER}$ low initiating a turn off transition. The logic low PWM input to the NAND gate and the logic low input to the NAND gate from flip flop 1 force the NAND gate output to be logic high while the PWM control signal is low so that the Q output of flip flop 2 must remain low as long as the PWM control signal is low, regardless of the output of the discharge current detector circuit.

When the drain voltage is falling rapidly the capacitor $C_{DRAIN}$ is discharging and the non-inverting input to the comparator $U_1$ in FIG. 6 is driven low through $R_5$. $R_5$ serves to limit the current at the non-inverting input to $U_1$ which will typically have intrinsic input protection diodes so that its inputs cannot be driven beyond the supply rails. A comparator without intrinsic input protection diodes is unsuitable for this application. While the drain voltage is falling the output of $U_1$ is low. When the drain voltage is invariant the non-inverting input of $U_1$ is biased slightly higher than the inverting input of $U_1$ so that the $U_1$ output is in a logic high state. $C_{DRAIN}$ is typically a very small value capacitor, a picofarad or a few picofarads is sufficient for most off line applications, but for lower voltage applications 10 picofarads or a few tens of picofarads may be more suitable. $R_1$ and $R_2$ can be set so that the voltage at the inverting input to $U_1$ is near to the mid point of the supply voltage range. $C_{BIAS}$ should be sufficiently large that the inverting input voltage is not driven to the supply rails through $R_3$ while $C_{DRAIN}$ is charging or discharging. $R_4$ and $R_3$ bias the non-inverting input to $U_1$ slightly higher than the inverting input to $U_1$ so that the output to $U_1$ will be high if there is either no discharge current or small discharge current. Typically $R_4$ would be larger than $R_3$. If $C_{BIAS}$ is sufficiently large and $R_3$ sufficiently small the maximum charge and discharge currents may be insufficient to drive the non-inverting input of $U_1$ to a supply rail and the value of $R_5$ can be reduced to zero. The value of the components $C_{DRAIN}$, $C_{BIAS}$, $R_3$, $R_4$, and $R_5$ have an effect on the response time of the circuit. Minimal values for all provides the fastest response, but may be incompatible with other design goals such as low power consumption and $U_1$ input circuit protection.

Figure 7:
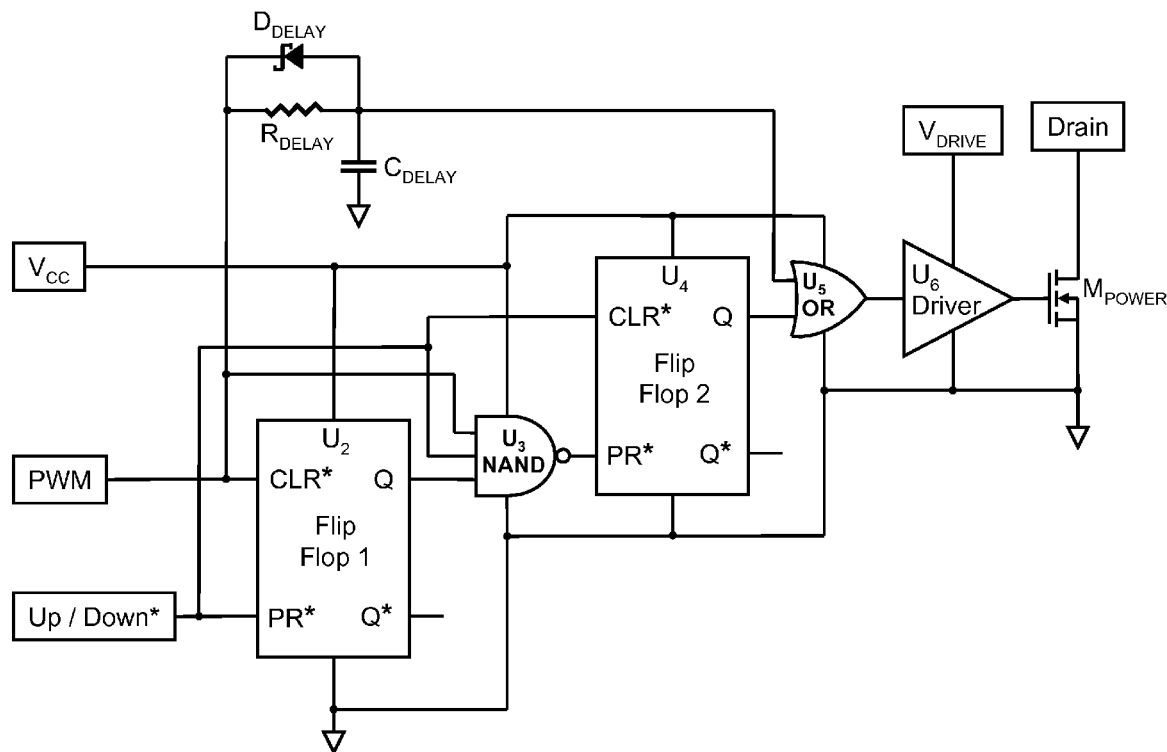
FIG. 7 illustrates a digital logic and driver circuit that is responsive to the sequence of output states of the discharge current detector circuit of FIG. 6 according to the subject invention.

Another embodiment of the subject invention is illustrated in FIG. 7. The FIG. 7 embodiment adds an OR gate $U_5$ and a delay network which includes a capacitor $C_{DELAY}$, a resistor $R_{DELAY}$, and a diode $D_{DELAY}$ to the FIG. 5 adaptive gate drive timing circuit. The addition of the delay network and the OR gate effectively places a maximum delay time on the turn on transition from the time that the PWM control signal transitions to the high state until the gate of $M_{POWER}$ is enabled. The establishment of a maximum delay time provides a start up mechanism for the power supply circuit when there is zero initial drain circuit energy. The resistor $R_{DELAY}$ and capacitor $C_{DELAY}$ set the maximum delay time and the diode $D_{DELAY}$ provides a means to avoid any delay in the turn off transition for $M_{POWER}$.

Figure 8:
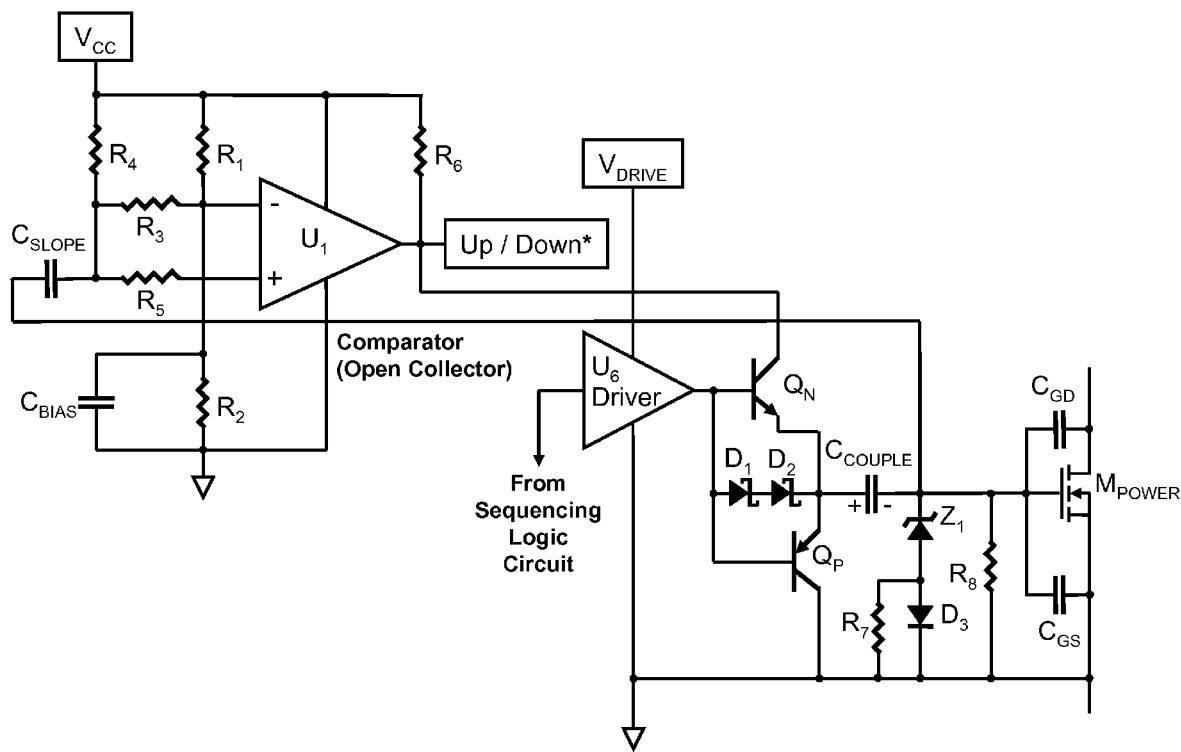
FIG. 8 illustrates an adaptive gate drive timing circuit that is responsive to the discharge current of an intrinsic gate drain capacitor of a mosfet to accomplish optimal timing without the use of high voltage components according to the subject invention.
Figure 9:
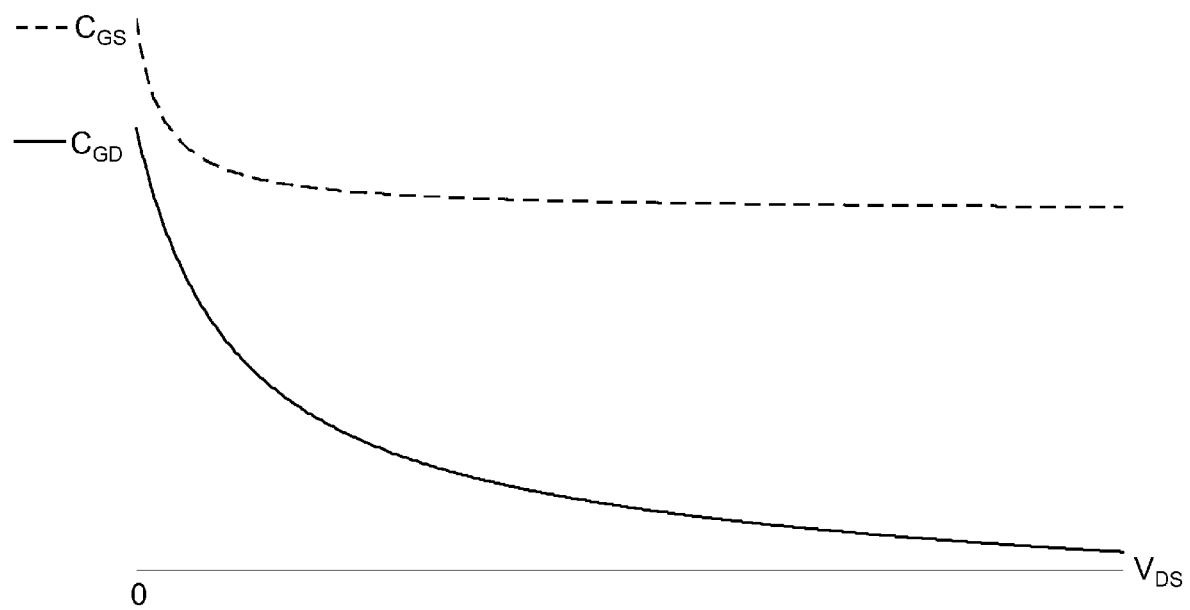
FIG. 9 illustrates the relationship between gate drain capacitance and drain source voltage and the relationship between gate source capacitance and drain source voltage for a typical mosfet.

Another embodiment of the subject invention is illustrated in FIG. 8. The FIG. 8 embodiment relies on the intrinsic gate drain capacitance of the mosfet $M_{POWER}$ to provide a discharge current that can be sensed to provide optimal gate drive timing. In the FIG. 8 circuit the intrinsic gate drain capacitance of the mosfet is the drain connected capacitor for discharge current sensing. In the FIG. 8 circuit the gate of the mosfet must be sensed in order to sense the discharge current of the gate drain capacitance. This arrangement has the advantage that no discrete high voltage capacitor is required and no other high voltage components are required to accomplish optimal gate drive timing. It also has the advantage of a relatively large value drain connected capacitance, since the intrinsic gate drain capacitance is effectively much larger than a few picofarads. The disadvantage of this arrangement is that there is also a gate source capacitance connected at the gate terminal of $M_{POWER}$ and the gate terminal of $M_{POWER}$ is the terminal of $M_{POWER}$ that must be controlled, so that we are attempting to control and drive the same terminal that we are sensing. In the FIG. 8 circuit the gate terminal is sensed prior to the time that it is driven and controlled. The effect of the additional capacitance connected at the gate terminal is to absorb some of the charge of the gate drain capacitance as it discharges. Both the gate drain capacitance and gate source capacitance are non-linear and dependent on drain source voltage, but the gate drain capacitance is highly dependent on drain source voltage over the entire range of drain source voltage and the gate source capacitance is only highly dependent on drain source voltage in the region near zero volts, as illustrated in FIG. 9. In the FIG. 8 circuit the discharge current of the intrinsic gate drain capacitance $C_{GD}$ is sensed initially through $C_{SLOPE}$ in the manner described above for the FIG. 6 discharge current detector. The discharge current in $C_{GD}$ drives the gate voltage of $M_{POWER}$ low which is sensed by the comparator $U_1$ through $C_{SLOPE}$. As the gate of $M_{POWER}$ is driven lower in voltage by the discharge current of $C_{GD}$ the base emitter junction of NPN bipolar transistor $Q_N$ becomes forward biased. When $Q_N$ becomes forward biased it provides the signal indicating the presence of the discharge current at the output of comparator $U_1$. Shortly thereafter the open collector output of $U_1$ enters its high impedance state. When the discharge current of $C_{GD}$ ceases the current in $Q_N$ ceases and the collector voltage of $Q_N$ transitions to a logic high state triggering a logic high input to the driver which enables the gate of $M_{POWER}$ through rectifiers $D_1$ and $D_2$. The PNP bipolar transistor exists to speed up the turn off transition of $M_{POWER}$ but plays no role in discharge current sensing. Also, components $C_{COUPLE}$, $Z_1$, $D_3$, $R_7$, and $R_8$ play no role in discharge current sensing, but these components play a role in setting the voltage range of the gate to provide full enhancement and a high speed turn off transition for low turn off transition switching losses. The FIG. 8 circuit relies on the sequencing logic illustrated in FIG. 5 and FIG. 7, but the sequencing circuit is not illustrated in FIG. 8. The FIG. 8 circuit provides optimal turn on timing under all initial conditions without using high voltage circuit elements.

CONCLUSION, RAMIFICATIONS, AND SCOPE OF INVENTION

Thus the reader will see that an adaptive gate drive timing circuit that relies on detection of a discharge current in a drain connected capacitance can provide optimal switch turn on timing for a zero voltage switching power converter for both energy sufficient and energy insufficient initial conditions, thereby obviating a high voltage rectifier and enabling the use of a low voltage ASIC for optimal switch turn on timing with no high voltage components.

While my above description contains many specificities, these should not be construed as limitations on the scope of the invention, but rather, as exemplifications or preferred embodiments thereof. Many other variations are possible. For example, circuits similar to the circuits shown but with polarity of the input or output reversed or the polarity of switches reversed from that illustrated in the figures shall be considered embodiments of the subject invention. Also, other discharge current detection circuits are possible, including circuits that sense a voltage difference at the terminals of a current sensing resistor placed to conduct all or some of the discharge current and other sequencing circuits are possible using different sets of logic circuit elements. Also the illustrations apply the new technique to a N channel power mosfet, but the technique applies equally to P channel power mosfets, to JFETs, and to IGBTs and bipolar transistors, which should be considered embodiments of the subject invention. Also, my description is illustrated using a PWM control signal, but other forms of modulation are possible to establish the timing necessary for turn on and turn off of the controlled switch and these other modulation forms should be considered embodiments of this invention. Also, the examples provided illustrate the application of the novel adaptive gate drive timing circuit to a ZVS main switch in a power supply, but the adaptive gate drive timing circuit can also be used to drive and optimally time a turn on transition for a synchronous rectifier and that application should be considered an embodiment of the subject invention.

Accordingly, the scope of the invention should be determined not by the embodiments illustrated, but by the appended claims and their legal equivalents.

I claim:

1. An adaptive gate drive timing circuit for a power mosfet comprising,
    a capacitance having two terminals with a first terminal connected to a drain terminal of said power mosfet and a second terminal connected to a gate of said power mosfet,
    a sequencing circuit responsive initially to a discharge current of said capacitance and subsequently to the absence of said discharge current of said capacitance and responsive to a control signal from a modulation circuit for controlling a voltage or a current of an input or an output of a power supply circuit, comprising,
        a detector circuit sensitive to the existence of a discharge current in said capacitance,
        a digital logic circuit,
    a driver circuit for fast charge and fast discharge of a gate of said power mosfet,
    whereby said adaptive gate drive timing circuit provides optimal turn on timing for said power mosfet for the condition in which sufficient energy is available to drive a zero voltage turn on transition for said power mosfet and for the condition in which insufficient energy is available to drive a zero voltage turn on transition for said power mosfet.

2. The adaptive gate drive timing circuit as set forth in claim 1 wherein said capacitance is an intrinsic gate drain capacitance of said power mosfet.

3. The adaptive gate drive timing circuit as set forth in claim 1 wherein said capacitance is a discrete capacitor extrinsic to said power mosfet.

* * * * *